(12) United States Patent
Shinogi et al.

(10) Patent No.: US 6,717,243 B2
(45) Date of Patent: Apr. 6, 2004

(54) SEMICONDUCTOR DEVICE AND THE MANUFACTURING METHOD THEREOF

(75) Inventors: Hiroyuki Shinogi, Oizumi-Machi (JP); Toshimitsu Taniguchi, Oizumi-Machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/183,980

(22) Filed: Jun. 28, 2002

(65) Prior Publication Data

US 2003/0001226 A1 Jan. 2, 2003

(30) Foreign Application Priority Data

Jun. 28, 2001 (JP) ........................................ 2001-196004

(51) Int. Cl.$^7$ ............................................. H01L 23/495
(52) U.S. Cl. ........................ 257/673; 257/737; 257/738; 257/748; 257/751; 257/779
(58) Field of Search ........................ 257/673, 737–751, 257/779, 153, 296, 306, 307, 308

(56) References Cited

U.S. PATENT DOCUMENTS

| | | | | |
|---|---|---|---|---|
| 5,723,822 A | * | 3/1998 | Lien | 174/250 |
| 5,933,737 A | * | 8/1999 | Goto | 438/291 |
| 5,989,991 A | * | 11/1999 | Lien | 438/612 |
| 6,455,892 B1 | * | 9/2002 | Okuno et al. | 257/328 |
| 2001/0005624 A1 | * | 6/2001 | Aoyagi et al. | 438/622 |
| 2001/0019180 A1 | * | 9/2001 | Aoyagi et al. | 257/784 |

* cited by examiner

Primary Examiner—David Nelms
Assistant Examiner—Long Tran
(74) Attorney, Agent, or Firm—Morrison & Foerster LLP

(57) ABSTRACT

A semiconductor device has a bump electrode formed on a flat surface of a passivation film of the device. The bump electrode is connected to a top wiring layer through a plurality of openings in the passivation film underneath the bump electrode, which are filled with a conductive material. The bump electrode is formed away from via holes, which connects the top wiring layer for the bump electrode and a lower wiring layer connected to source and drain layers of the device.

6 Claims, 14 Drawing Sheets

FIG.1A
FIG.1B
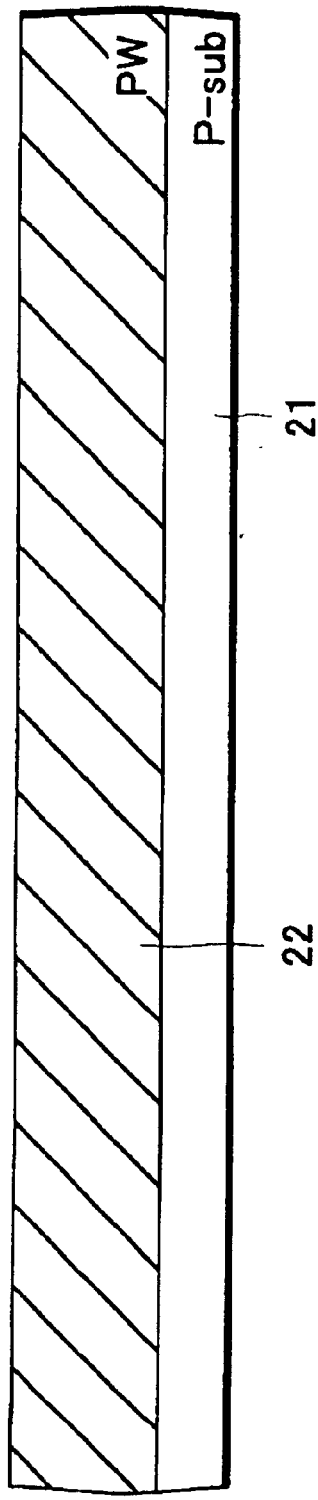
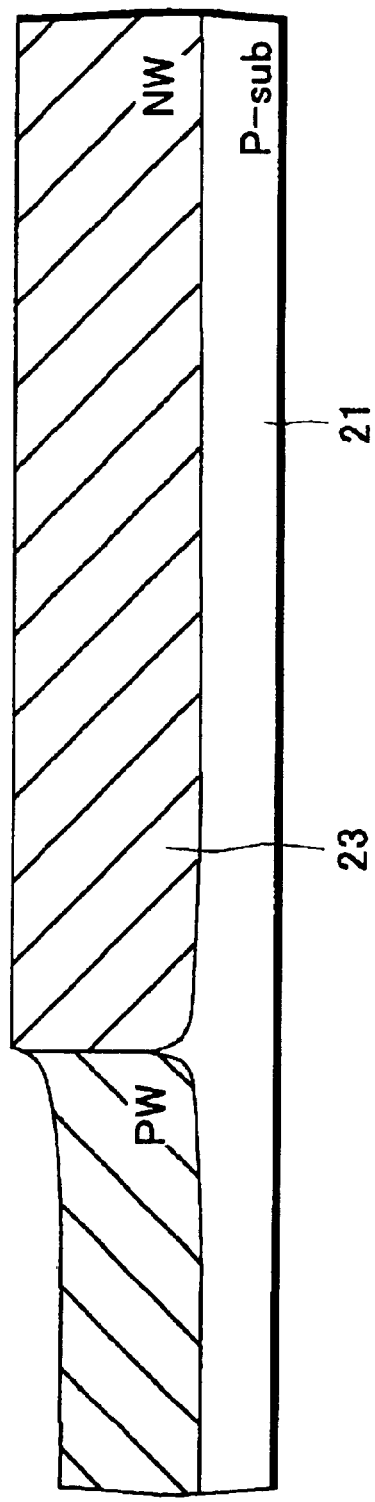

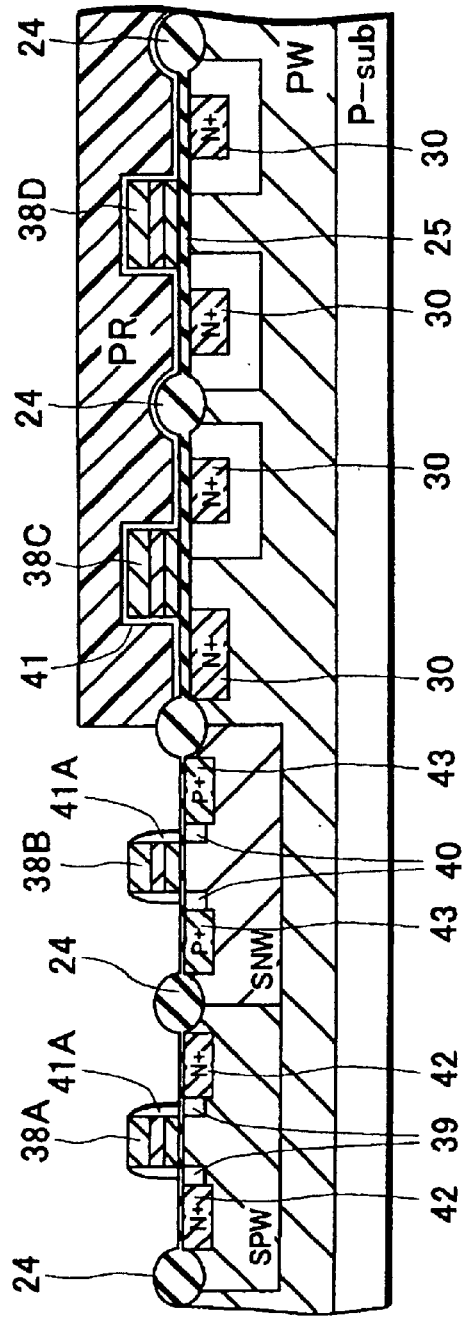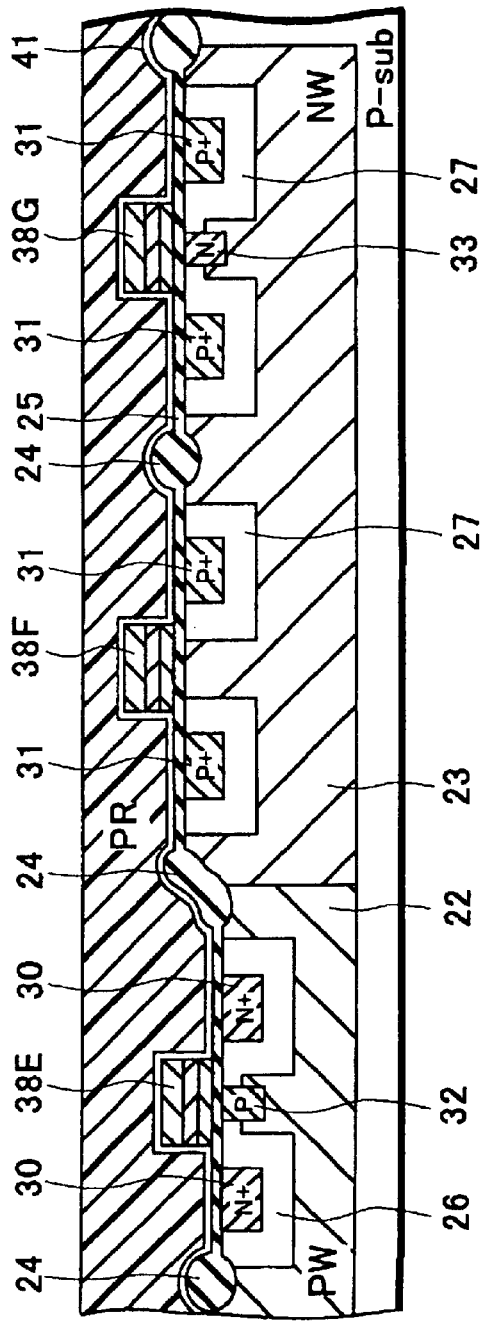

SEMICONDUCTOR DEVICE AND THE MANUFACTURING METHOD THEREOF

BACKGROUND OF THE INVENTION

1. Field of the Invention

This invention relates to a semiconductor device and its manufacturing method, specifically to a formation of bump electrode.

2. Description of the Related Art

FIGS. 14A and 14B show a cross-sectional view and a schematic plan view, respectively, of a conventional bump electrode structure.

The reference numeral 1 indicates a semiconductor substrate, on which an insulating film 2 made of a LOCOS oxide film is disposed. A lower wiring layer 3 is placed on the insulating film 2.

An interlayer insulating film 4 is formed to cover the lower wiring layer 3. An upper wiring layer 6 is formed on the interlayer insulating film 4 and makes contact with the lower wiring layer 3 through via holes 5 formed in the interlayer insulating film 4. A via hole is a contact hole connecting two wiring layers.

A passivation film 7 is disposed to cover the upper wiring layer 6 and a gold bump electrode 8 is placed at a pad portion 7A, which is formed by making an opening in the passivation film 7. FIG. 14A is a cross sectional view of a bump electrode structure shown in FIG. 14B cut along line A—A in FIG. 14B. FIG. 14B is a schematic plan view showing a configuration of the lower wiring layer 3, the upper wiring layer 6, the pad portion 7A and the gold bump electrode 8, omitting the passivation film 7 and the interlayer insulation film 4 for the sake of simplicity.

SUMMARY OF THE INVENTION

The invention provides a semiconductor device including a semiconductor substrate and a passivation film formed on the semiconductor substrate and having a plurality of openings. A conductive material fills in each of the openings. The device also includes a bump electrode making contact with conductive material and covering all the openings.

The invention also provides a semiconductor device including a gate oxide film disposed on a semiconductor substrate and a gate electrode disposed on the gate oxide film. A source layer and a drain layer are each disposed adjacent to the gate electrode. A semiconductor layer is disposed underneath the gate electrode and forms a channel. The device also includes a lower wiring layer making contact with the source layer and the drain layer, an insulating film covering the lower wiring layer, and an upper wiring layer making contact with the lower wiring layer through a via hole formed in the insulating film. A passivation film covers the upper wiring layer and has a plurality of openings. A conductive material fills in each of the openings. The device also includes a bump electrode making contact with conductive material and covering all the openings.

The invention further provides a manufacturing method of semiconductor device including providing a semiconductor substrate and forming an insulating film on the semiconductor substrate. This is followed by forming a wiring layer on the insulating film, forming a passivation film covering the wiring layer, and forming a plurality of openings in the passivation film. The method also includes filling the openings with a conductive material, and forming a bump electrode making contact with conductive material and covering all the openings.

The invention also provides a manufacturing method of semiconductor device including providing a semiconductor substrate of a first conductivity type and forming a gate oxide film on the semiconductor substrate. This is followed by forming a first source layer and a first drain layer each having a second conductivity type, and forming a layer of the second conductivity type connecting the first source layer and the first drain layer. The method also includes forming a second source layer of the second conductivity type in the first source layer and forming a second drain layer of the second conductivity type in the first drain layer. The impurity concentration of the second source and second drain layers is higher than the impurity concentration of the first source and first drain layers. The method further includes forming a body layer of the first conductivity type in an area for the gate electrode formation so that the body layer penetrates the layer of the second conductivity type connecting the first source layer and the first drain layer. This is followed by forming a gate electrode in the area for the gate electrode formation, forming a first insulating film on the gate electrode, and forming a lower wiring layer on the first insulating film. The lower wiring layer makes contact with the second source layer and the second drain layer through the first insulating film. The method also includes forming a second insulating film on the lower wiring layer, forming a via hole in the second insulating film, and forming an upper wiring layer on the second insulating film. The upper wiring layer makes contact with the lower wiring layer through the second insulating film while the via hole of the second insulating film provides a conduit between the upper and lower wiring layers. The method further includes forming a passivation film on the upper wiring layer, and forming a plurality of openings in the passivation film. The method also includes filling the openings with a conductive material, and forming a bump electrode making contact with conductive material 10 and covering all the openings.

BRIEF DESCRIPTION OF THE DRAWINGS

FIGS. 1A and 1B are cross-sectional views showing a processing step of an embodiment of a method of manufacturing semiconductor device of this invention.

FIGS. 10A and 10B are cross-sectional views showing a processing step of the embodiment.

DESCRIPTION OF THE INVENTION

Figure 2A:
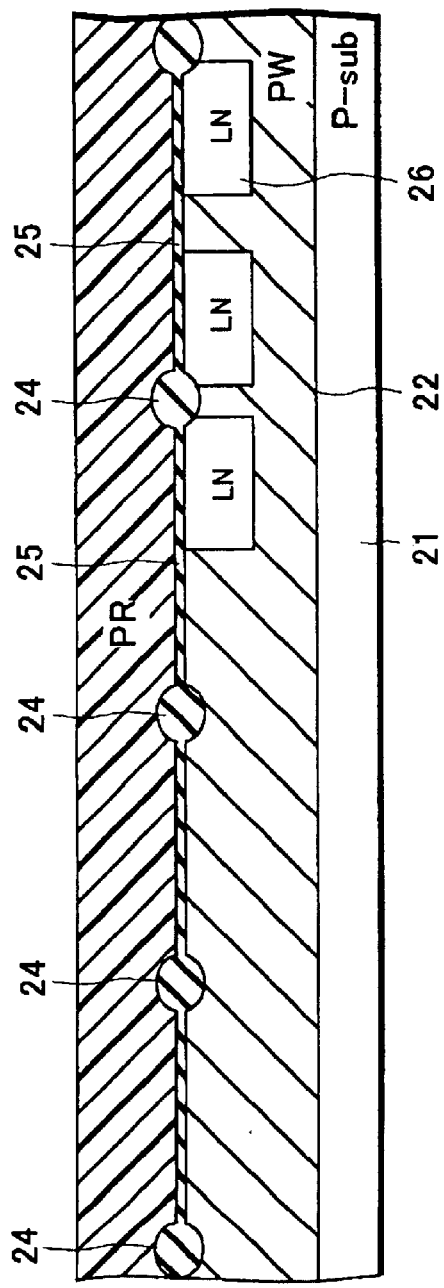
FIGS. 2A and 2B are cross-sectional views showing a processing step of the embodiment.

An embodiment of a manufacturing method of semiconductor device of this invention and a semiconductor device made by the method will be described with reference to FIGS. 1A–13. The embodiment involves a driver for display device having various kinds of MOS transistors.

The display device described above includes various kinds of flat panel display devices such as LCD display device, LED display device, organic EL (electroluminescence) display device, inorganic EL display device, PDP (plasma display device) and FED (field emission display device), among other devices.

As an example, a driver having an anode driver and a cathode driver for driving an organic EL display device will be described. The driver makes an organic EL element emit light by supplying a constant electric current to the organic EL element. Since the EL element is a self-luminous element, it does not require a backlight, which is usually needed for a liquid crystal display device. Also, the EL element does not have a limit of viewing angle. With these advantages, the EL display device is expected to replace the LCD device in near future. Especially, the organic EL element provides a display with a high brightness. The organic EL element is also superior to the inorganic EL in efficiency, responsiveness and multiple color display capability.

FIG. 10A shows a driver for driving the EL display device described above. The figure shows, from the left side, an N-channel MOS transistor and a P-channel MOS transistor of a logic system (for example, 3V), an N-channel MOS transistor for a level shifter (for example, 30V), and an N-channel transistor of high breakdown strength (for example, 30V). In the FIG. 10B, the driver includes, from the left side, an N-channel MOS transistor of high breakdown strength with lowered on-resistance (for, example, 30V), a P-channel MOS transistor of high breakdown strength, and a P-channel MOS transistor of high breakdown strength with lowered on-resistance (for example, 30V). In order to differentiate the MOS transistor of high breakdown strength described above from the MOS transistor of high breakdown strength with lowered on-resistance, the MOS transistor of high breakdown strength with lowered on-resistance will be referred to as a SLED (slit channel by counter doping with extended shallow drain) MOS transistor, hereinafter.

In the semiconductor of this embodiment, as shown in FIGS. 10A and 10B, an N-type well 23 includes a P-channel MOS transistor of high breakdown strength and a P-channel SLEDMOS transistor of high breakdown strength with lowered on-resistance. The N-type well 23 forms an upper portion of the device. A P-type well 22 includes other various MOS transistors and forms a lower portion of the device. In other words, the N-channel MOS transistor and the P-channel transistor of the fine logic system (for example, 3V) are placed on the lower portion of the device.

The device intermediate described above is manufactured according to a manufacturing method, which includes processing steps described below. In FIGS. 1A and 1B, the P-type well (PW) 22 and the N-type well (NW) 23 are formed inside a P-type semiconductor substrate (P-sub) 21 by using LOCOS method in order to determine the area for forming various kinds of MOS transistors. That is, a pad oxide film and a silicon nitride film are placed on the N-type well region of the substrate 21. Then, an ion implantation layer is formed by implanting boron ions with an 80 KeV acceleration voltage and an implantation condition of $8 \times 10^{12}/cm^2$, after masking the pad oxide film and the silicon nitride film. Then, the surface of the substrate is field oxidized through LOCOS method with the silicon nitride film as a mask to form a LOCOS film. During this process, the boron ions, which have been implanted under the area for forming the LOCOS film, are diffused into the substrate, making a P-type layer.

Next, phosphorus ions are implanted with an 80 KeV acceleration voltage and an implantation condition of $9 \times 10^{12}/cm^2$ on the surface of the substrate with the LOCOS film as a mask to form an ion implantation layer, after removing the pad oxide film and the silicon nitride film. The impurity ions implanted into the substrate are then thermally diff-used, after removing the LOCOS film. As shown in FIGS. 1A and 1B, the P-type well 22 placed in the substrate 21 is located at the lower portion of the device and the N-type well 23 is located at the upper portion of the device.

Figure 2B:
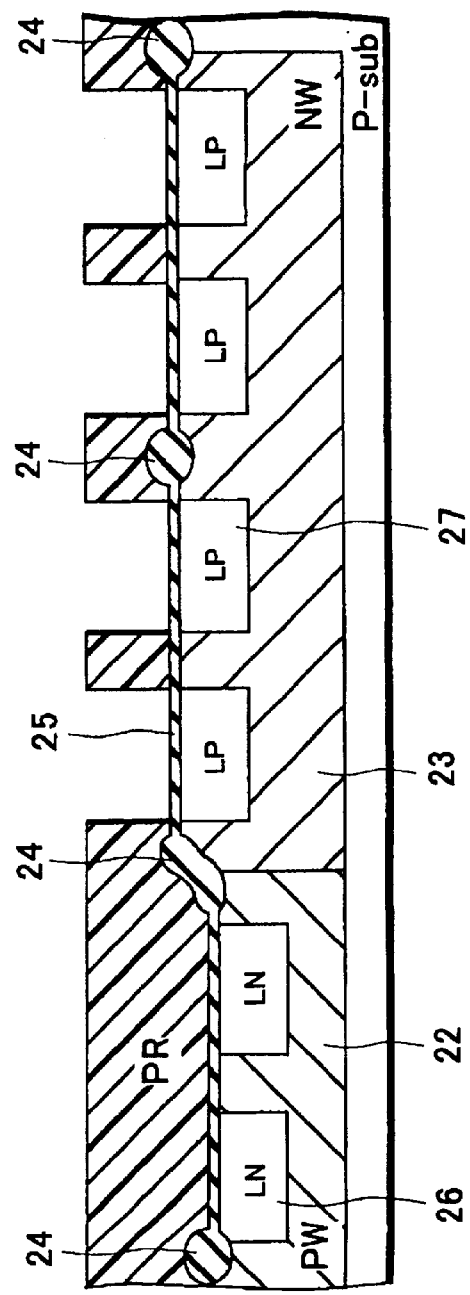

As seen from FIGS. 2A and 2B, an element separation film 24 of 500 nm is formed by the LOCOS method for separating the elements for each of the MOS transistors. On the active area excluding the element separation film 24, a thick oxide film 25 of high breakdown strength of about 80 nm is formed.

Then, the first N-type and P-type source and drain layers of low impurity concentration (referred to as an LN layer 26 and an LP layer 27 hereinafter) are formed by using a photoresist film as a mask. That is, the surface area of the substrate excluding the area for the LN layer is first covered with the photoresist film (not shown in the figure). Then, phosphorus ions are implanted with an acceleration voltage of 120 KeV and with an implantation condition of $8 \times 10^{12}/cm^2$ to form the LN layer 26. Next, the surface area of the substrate excluding the area for the LP layer is covered with the photoresist (PR) film, and then boron ions are implanted with an acceleration voltage of 120 KeV and with an implantation condition of $8.5 \times 10^{12}/cm^2$ to form the LP layer 27. The implanted ions described above are thermally diffused forming the LN layer 26 and the LP layer 27 during an anneal processing (for example, in $N_2$ atmosphere at $1100°_V$ for 2 hours).

Figure 3A:
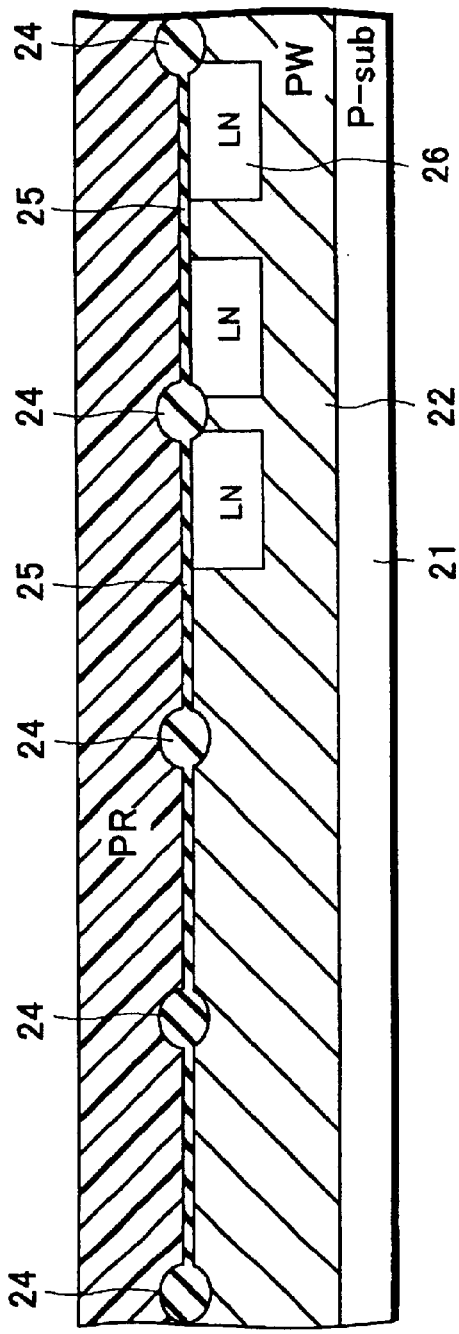
FIGS. 3A and 3B are cross-sectional views showing a processing step of the embodiment.
Figure 3B:
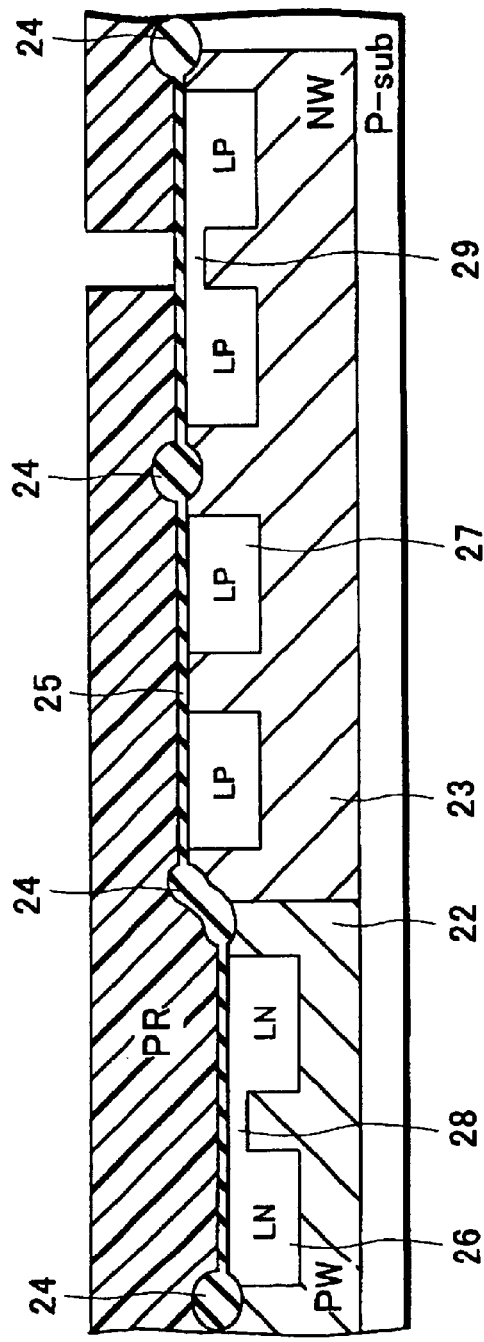

Then, as shown in FIG. 3B, second N-type and P-type source and drain layers (referred to as an SLN layer 28 and an SLP layer 29 hereinafter) of low impurity concentration are formed at the area between LN layers 26 and the area between the LP layers 27, respectively, which have been formed at the areas for the P-channel and the N-channel SLEDMOS transistors, by using a photoresist film as a mask. That is, the surface area of the substrate excluding the area for the SLN layer is first covered with the photoresist film (not shown in the figure). Then, phosphorus ions are implanted with an acceleration voltage of 120 KeV and with an implantation condition of $1.5 \times 10^{12}/cm^2$ to form the SLN layer 28 adjacent to the LN layers 26. Next, the surface area of the substrate excluding the area for the SLP layer is covered with the photoresist (PR) film, and then boron difluoride ions ($^{49}BF_2^+$) are implanted with an acceleration voltage of 140 KeV and with an implantation condition of $2.5 \times 10^{12}/cm^2$ to form the SLP layer 29 adjacent to the LP layers 27. The impurity concentrations are determined to be about the same between the LN layer 26 and SLN layer 28, and between the LP layer 27 and the SLP layer 29. It is also possible to have different impurity concentrations among the corresponding layers.

Figure 4A:
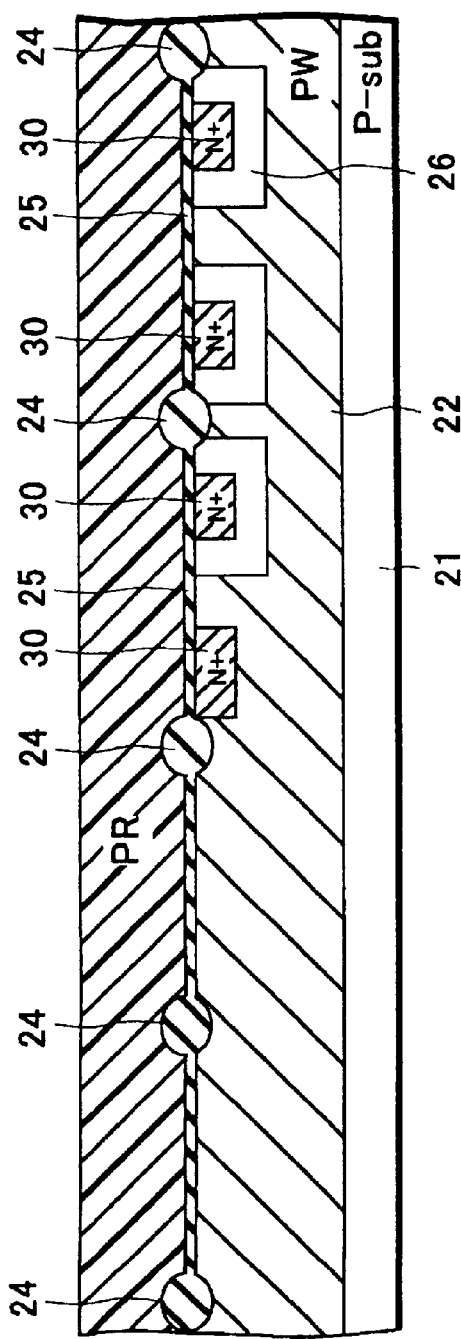
FIGS. 4A and 4B are cross-sectional views showing a processing step of the embodiment.
Figure 4B:
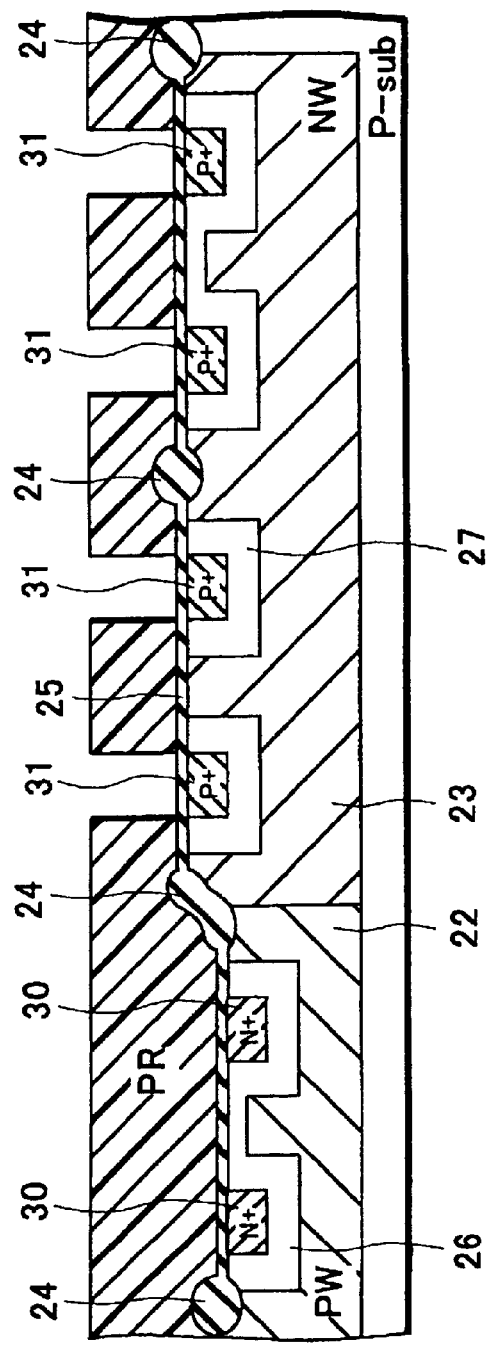

Then, as shown in FIGS. 4A and 4B, N-type and P-type source and drain layers of high impurity concentration (referred to as an N+ layer 30 and a P+ layer 31 hereinafter) are formed by using a photoresist film as a mask. That is, the surface area of the substrate excluding the area for the N+ layer is first covered with the photoresist film (not shown in the figure). Then, phosphorus ions are implanted with an acceleration voltage of 80 KeV and with an implantation condition of $2 \times 10^{15}/cm^2$ to form the N+ layer 30. Next, the surface area of the substrate excluding the area for the P+ layer is covered with the photoresist (PR) film, and then boron difluoride ions are implanted with an acceleration voltage of 140 KeV and with an implantation condition of $2 \times 10^{15}/cm^2$ to form the P+ layer 31.

Figure 5A:
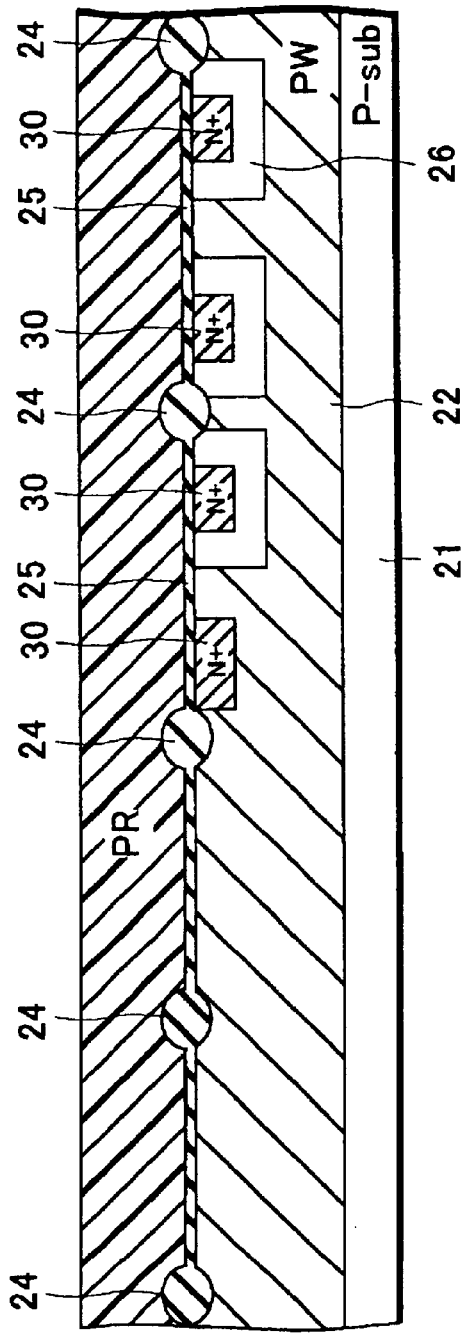
FIGS. 5A and 5B are cross-sectional views showing a processing step of the embodiment.
Figure 5B:
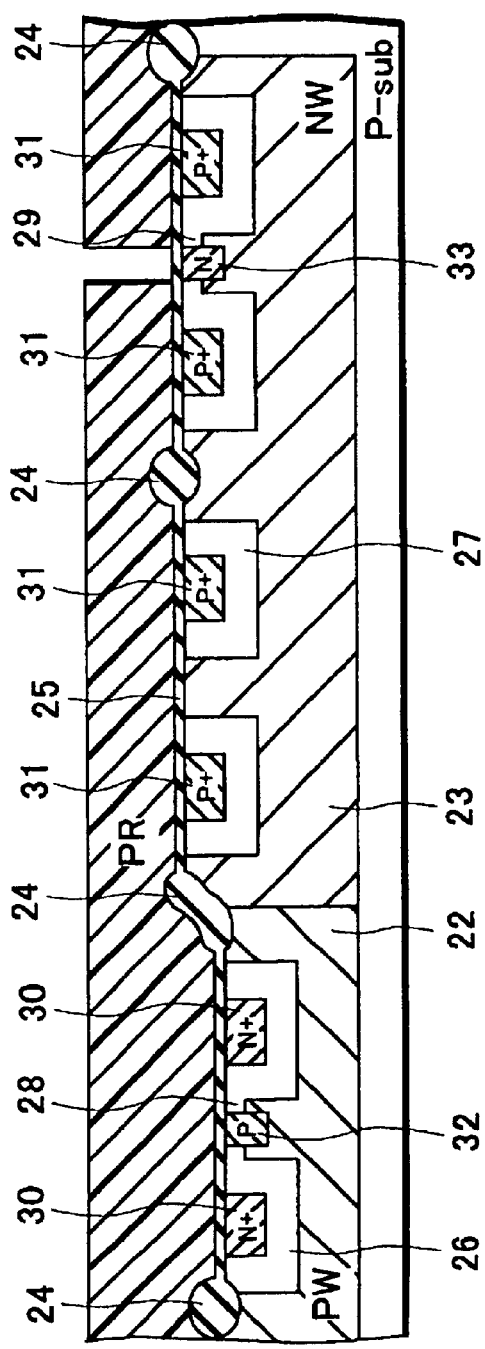

As shown in FIG. 5B, impurities having a second conductivity type are implanted through ion implantation into the middle of the SLN layer 28 adjacent to the LN layers 26 and the middle of the SLP layer 29 adjacent to the LP layers 27, respectively, by using the photoresist film as a mask, which has opening smaller than the mask opening for forming the SLN layer 28 and the SLP layer 29 (FIG. 3B) to form a P-type body layer 32 and an N-type body layer 33 for dividing the SLN layer 28 and the SLP layer 29, respectively. That is, the surface area of the substrate excluding the area for the P-type layer is covered with a photoresist film (not shown in the figure). Then, for example, boron difluoride ions are implanted with an acceleration voltage of 120 KeV and with an implantation condition of $5 \times 10^{12}/cm^2$ to form the P-type body layer 32. Then, the surface area of the substrate excluding the area for the N-type layer is covered with the photoresist (PR) film, and phosphorus ions are implanted with an acceleration voltage of 190 KeV and with an implantation condition of $5 \times 10^{12}/cm^2$ to form the N-type body layer 33. The order of the processes for the ion implantation processes shown in FIGS. 3A and 3B–5A and 5B is may be alternated. Channels are formed on the surface of the P-type body layer 32 and the N-type body layer 33.

Figure 6A:
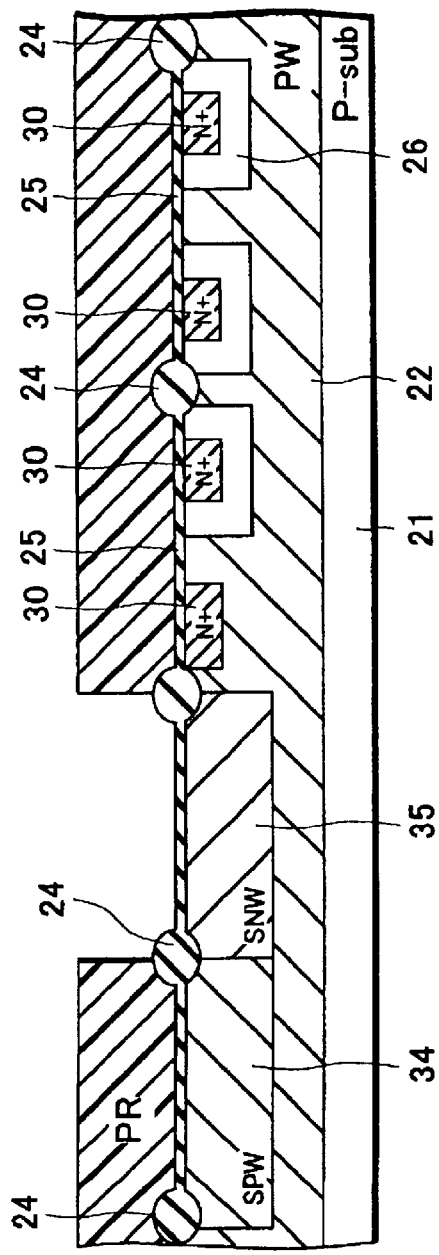
FIGS. 6A and 6B are cross-sectional views showing a processing step of the embodiment.
Figure 6B:
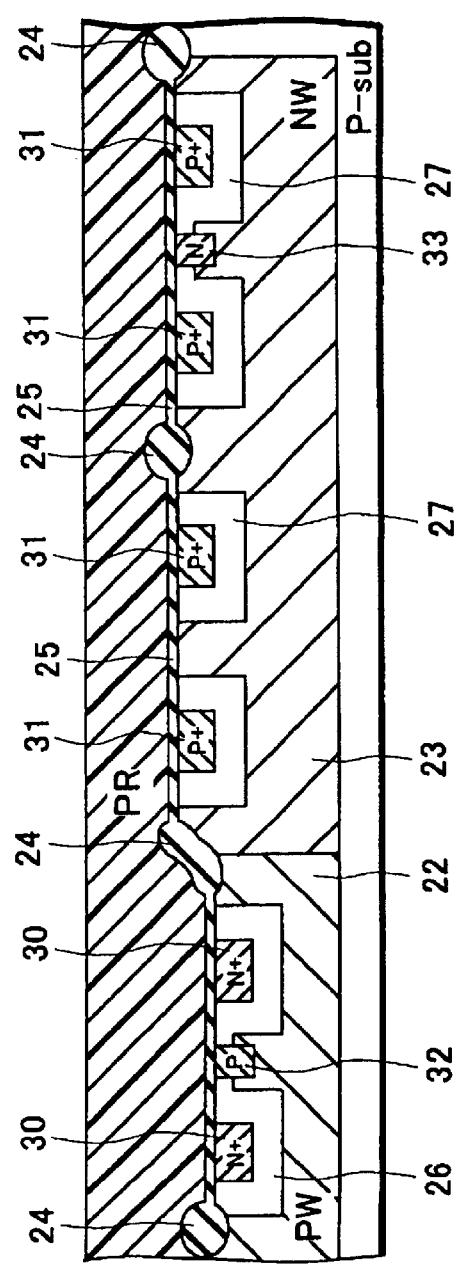

Then, as shown in FIG. 6A, inside the area for the N-channel and P-channel MOS transistors of fine patterning and of ordinary breakdown strength on the substrate, a second P-type well (SPW) 34 and a second N-type well (SNW) 35 are formed.

That is, boron ions, for example, are implanted with a 190 KeV acceleration voltage and with a first implantation condition of $1.5 \times 10^{13}/cm^2$ inside the P-type well 22 using a photoresist film as a mask, which has an opening in the area for the N-channel MOS of ordinary breakdown strength. Then, boron ions are implanted with a 50 KeV acceleration voltage and with a second implantation condition of $2.6 \times 10^{12}/cm^2$ to form a second P-type well 34. Also, phosphorus ions, for example, are implanted with a 380 KeV acceleration voltage and with an implantation condition of $1.5 \times 10^{13}/cm^2$ inside the P-type well 22 with a photoresist film (PR) as a mask, which has an opening in the area for the P-channel MOS transistor of ordinary breakdown strength, to form a second N-type well 35. If a high acceleration voltage generator capable of generating 380 KeV can not be provided, it is also possible to employ a double charge method, where divalent phosphorus ions are implanted with a 190 KeV acceleration voltage and with an implantation condition of $1.5 \times 10^{13}/cm^2$. Next, phosphorus ions are implanted with a 140 KeV acceleration voltage and with an implantation condition of $4.0 \times 10^{12}/cm^2$.

Figure 7A:
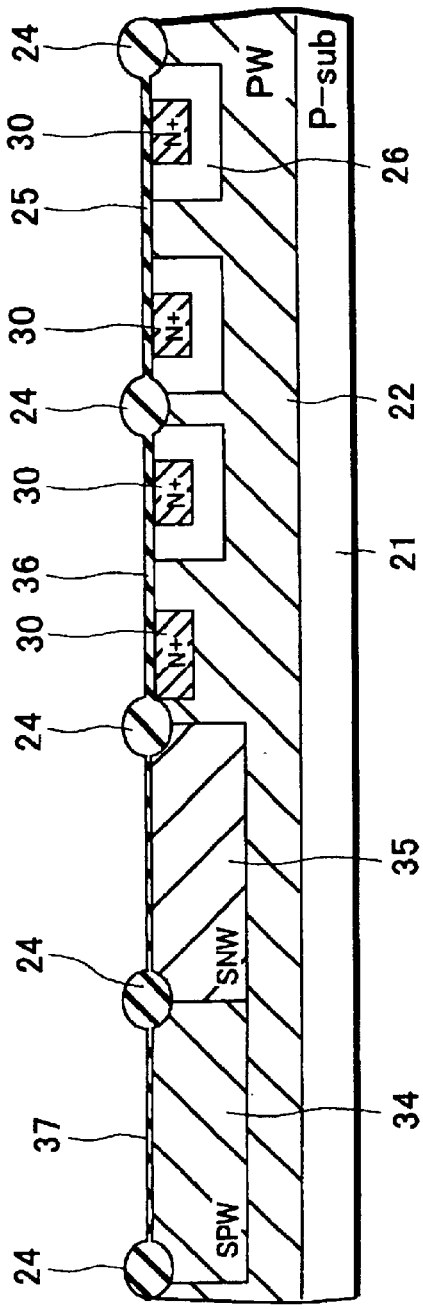
FIGS. 7A and 7B are cross-sectional views showing a processing step of the embodiment.
Figure 7B:
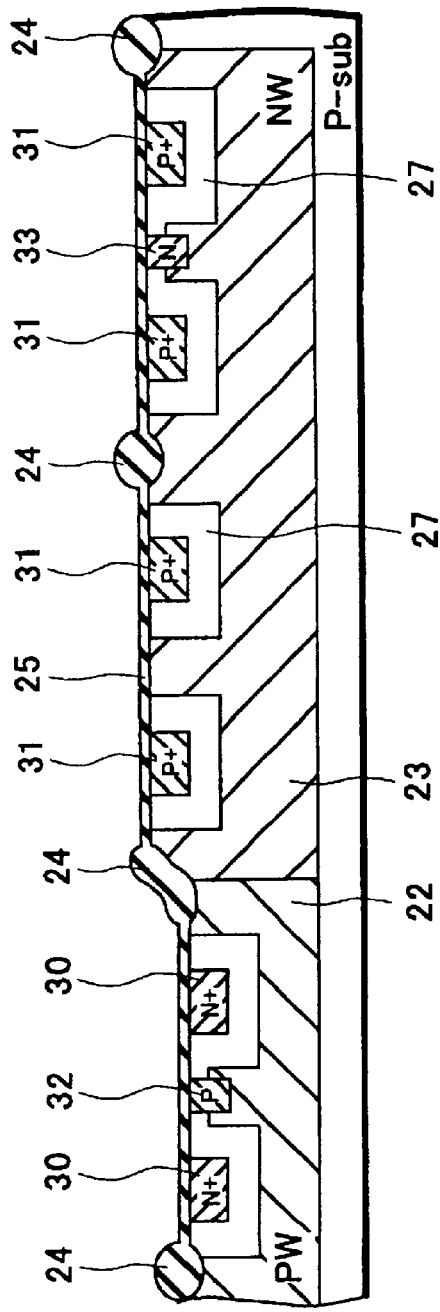

Then, the gate oxide film 25 is removed from the areas for the N-channel and the P-channel MOS transistors of ordinary breakdown strength and from the area for the N-channel MOS transistor for the level shifter. Then, as shown in FIGS. 7A and 7B, a new gate oxide film with a preferable thickness is formed on the areas, from which the gate oxide film 25 has been removed.

That is, a gate oxide film 36 having a thickness of about 14 nm (it is only about 7 nm at this step, but the thickness of the film will increase upon the formation of the gate oxide film of ordinary breakdown strength, as described later) is formed on the surface by thermal oxidation to be used for the N-channel MOS transistors of the level shifter. The gate oxide film 36 for the N-channel MOS transistor of the level shifter formed on the areas for the N-channel and the P-channel MOS transistors of ordinary breakdown strength is, then, removed. The thin gate oxide film 37 (about 7 nm) of ordinary breakdown strength is formed on the areas, from which the gate oxide film has been removed, by thermal oxidation.

Figure 8A:
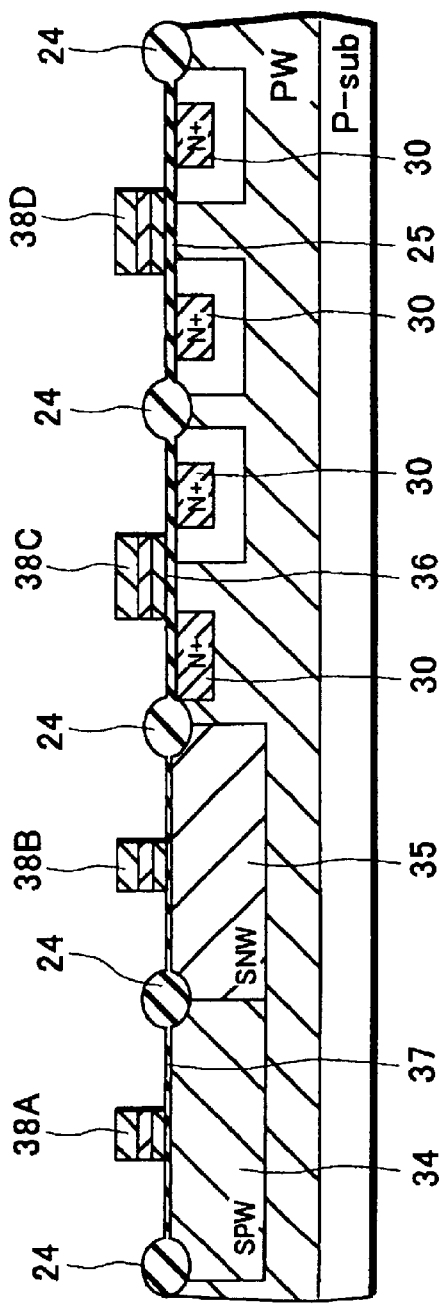
FIGS. 8A and 8B are cross-sectional views showing a processing step of the embodiment.
Figure 8B:
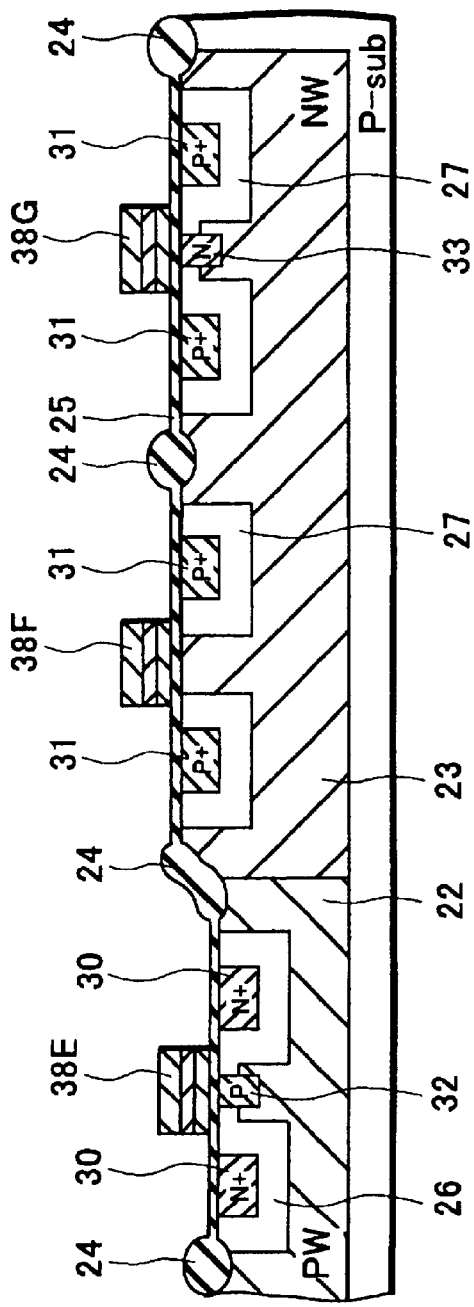

As shown in FIGS. 8A and 8B, polysilicon film having a thickness of 100 nm is formed on the entire surface. $POCl_3$ is thermally difflused into the polysilicon film to make the film conductive. Tungsten silicide film having a thickness of 100 nm and then, $SiO_2$ film having a thickness of 150 nm are formed on the polysilicon film. Through the patterning with photoresist, gate electrodes 38A, 38B, 38C, 38D, 38E, 38F, 38G for MOS transistors are formed. The $SiO_2$ film works as a hard mask during the patterning.

Figure 9A:
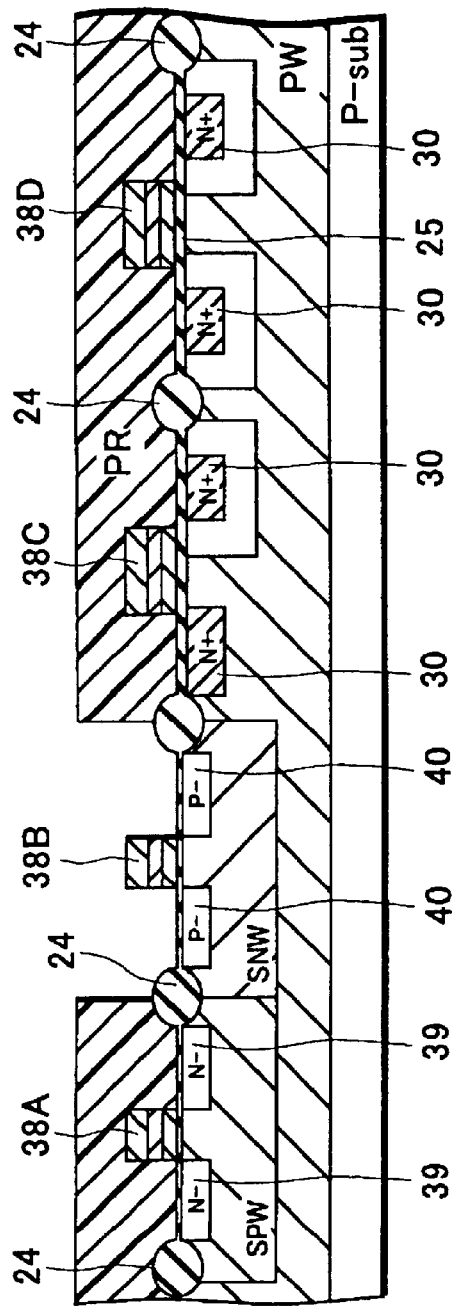
FIGS. 9A and 9B are cross-sectional views showing a processing step of the embodiment.
Figure 9B:
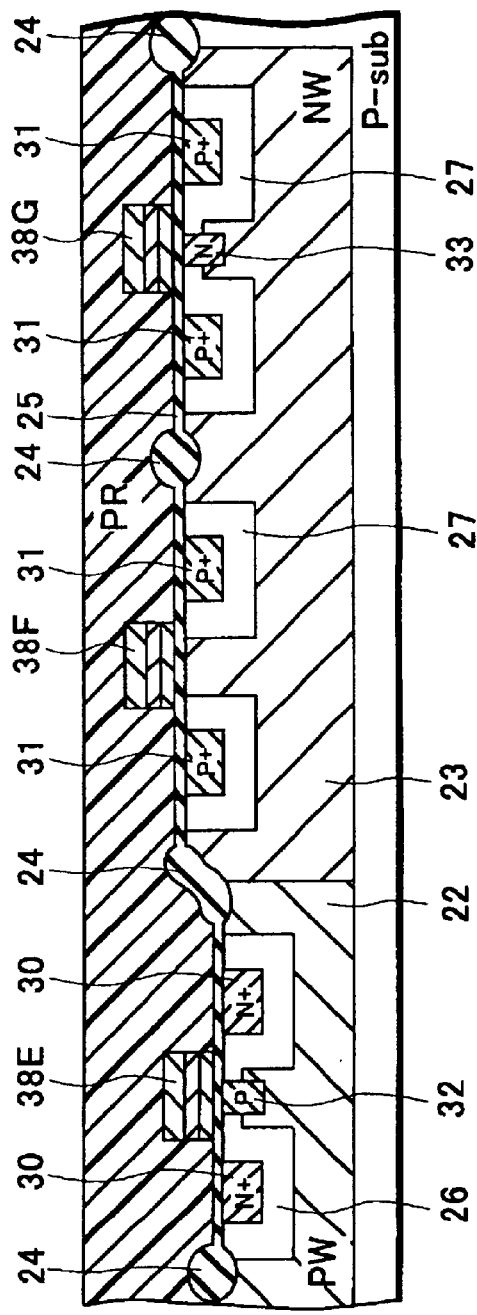

Next, as shown in FIG. 9A, source and drain layers of low impurity concentration are formed for the N-channel and the P-channel MOS transistors of ordinary breakdown strength.

That is, by using a photoresist film (not shown in the figure) as a mask, which covers the surface area of the substrate excluding the area for the source and the drain layers of low impurity concentration for the N-channel MOS transistor of ordinary breakdown strength, phosphorus ions, for example, are implanted with an acceleration voltage of 20 KeV and with an implantation condition of $6.2 \times 10^{13}/cm^2$ to form N-type source and drain layers 39 of low impurity concentration. Next, by using the photoresist film (PR) as a mask, which covers the surface area of the substrate excluding the area for the source and drain layers of low impurity concentration for the P-channel MOS transistor of ordinary breakdown strength, boron difluoride ions, for example, are implanted with an acceleration voltage of 20 KeV and with an implantation condition of $2 \times 10^{13}/cm^2$ to form P-type source and drain layers 40 of low impurity concentration.

Then, as shown in FIGS. 10A and 10B, a TEOS film 41 having a thickness of about 250 nm is formed using LPCV method to cover the gate electrodes 38A, 38B, 38C, 38D, 38E, 38F, and 38G. By using a photoresist film (PR) as a mask, which has openings in the areas for the N-channel and the P-channel MOS transistors of ordinary breakdown strength, the anisotropic etching is performed on the TEOS film. This creates side wall spacer films 41A at the both sides of the gate electrode 38A and 38B. The TESO film 41 remains at the area covered by the photoresist (PR) film.

The source and drain layers for the N-channel and the P-channel MOS transistors of high impurity concentration are formed by using the gate electrode 38A and the side wall spacer film 41A as well as the gate electrode 38B and the side wall spacer film 41A as masks.

That is, by using a photoresist film (not shown in the figure) as a mask, which covers the surface area of the substrate excluding the area for the source and drain of high impurity concentration for the N-channel MOS transistor of ordinary breakdown strength, arsenic ions, for example, are implanted with an acceleration voltage of 100 KeV and with an implantation condition of $5 \times 10^{15}/cm^2$ to form N+ type source and drain layers 42 of high impurity concentration. Next, by using the photoresist film (not shown in the figure) as a mask, which covers the surface area of the substrate excluding the area for the source and drain layers of high impurity concentration for the P-channel MOS transistor of ordinary breakdown strength, boron difluoride ions, for example, are implanted with an acceleration voltage of 40 KeV and with an implantation condition of $2 \times 10^{15}/cm^2$ to form a P+ type source and drain layers 43 of high impurity concentration.

After forming an interlayer insulating film having a thickness of about 600 nm made of a TEOS film or the BPSG film on the entire surface, a metal wiring layer making contact with the source and drain layers 30, 31, 42, 43 of high impurity concentration is formed, which completes the formation of the N-channel and the P-channel MOS transistors of ordinary breakdown strength, the N-channel MOS transistor for the level shifter, the N-channel and the P-channel MOS transistors of high breakdown strength, and the N-channel SLEDMOS and the P-channel SLEDMOS transistors of high breakdown strength with lowered on-resistance. All these transistors are included in the driver for the display device.

One of characteristics of this embodiment, in which an upper wiring layer makes contact with a lower wiring layer through via holes made in an interlayer insulating film covering the lower wiring layer, is that the surface of a bump electrode is flattened by not placing the via holes under the bump electrode. Rather, the via holes are formed in the interlayer insulating film away from the bump electrode.

Also, by placing a portion of the lower wiring layer underneath the bump electrode, the flatness around a pad portion, in which the bump electrode is formed, is maintained.

Next, processing steps of forming the bump electrode structure with related wiring, which is described above, is described with reference to FIGS. 11–13. As an example, formation of a bump electrode of the N-channel SLEDMOS transistor is described, but the same method is applicable to other transistors.

Figure 11:
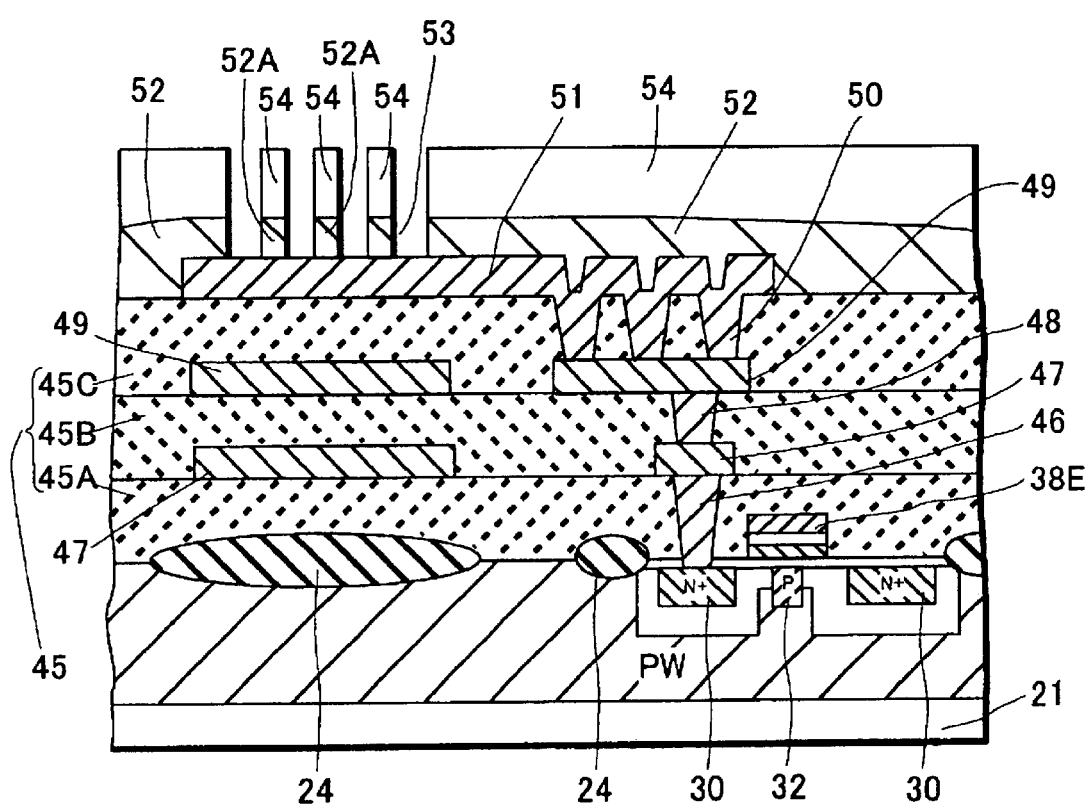
FIG. 11 is a cross-sectional view showing a processing step of the embodiment.

In FIG. 11, a first wiring layer 47 is formed on an interlayer insulating film 45A and is connected to the source layer 30 of the N-channel SLEDMOS transistor through a first contact hole 46 made in the interlayer insulating film 45A. Similar contact hole structure is formed on the drain layer 30, but omitted from the drawing for clear and simple presentation of the structure in the drawing. Then, a second wiring layer 49 is formed on the interlayer insulating film 45B and is connected to the first wiring layer through a via hole 48 made in the interlayer insulating film 45B. A third wiring layer 51 is formed on the interlayer insulating film 45C and is connected to the second wiring layer 49 through via holes 50 made in an interlayer insulating film 45C.

A passivation film 52 is formed to cover the third wiring layer 51. Then, a pad portion 53 is formed by making a plurality of openings in an area of the passivation film 52, on which a bump electrode 57 is formed. The pad portion 53 is about 30–80 $\mu$m in its size, and includes a portion 52A of the passivation film 52, which remains intact after the formation of the openings. As shown in FIG. 11, the pad portion is formed away from the via holes 50.

Figure 12A:
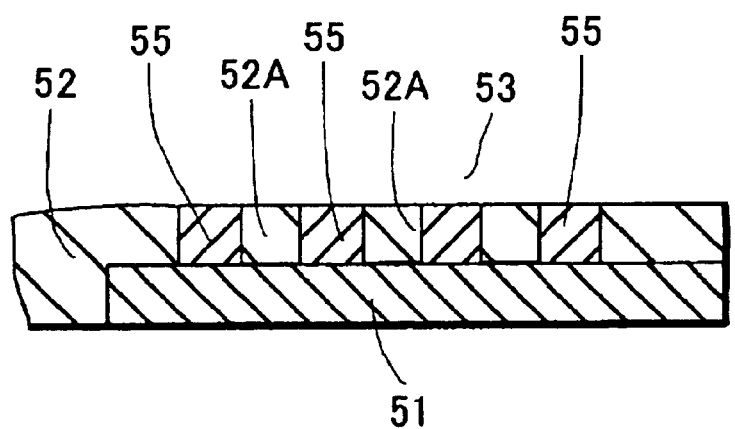
FIGS. 12A and 12B are cross-sectional views showing a processing step of the embodiment.

A conductive material 55 fills the openings in the passivation film 52, corresponding to a bump electrode structure, as shown in FIG. 12A. In this embodiment, tungsten is used as the conductive material. A tungsten film is, first, formed over the passivation film 52, including the openings, and, then, is etched back to the top surface of the passivation film to leave the conductive material only in the openings. Accordingly, the pad portion 53 has a flat surface consisting of the filled-in conductive material and the remaining passivation film 52, as shown in FIG. 12A. However, this embodiment is not limited this processing method. For example, CMP (Chemical Mechanical Polishing) method may be used to remove the conductive material formed over the passivation film 52.

This configuration reduces dent formation on the top surface of the bump electrode 57 because the conductive material fills the openings, and, thus, provides a flat base on which the bump electrode 57 is formed. The lower portion of the bump electrode 57 no longer has to sink into the openings to make contact with the third wiring layer 51. It is also noted that the remaining portion 52A of the passivation film 52 also provides support for the bump electrode 57 together with the filled-in openings.

Then, a barrier metal film 56 made of titanium nitride (TiN) film having a thickness of about 200 nm is formed on the passivation film 52 including the openings filled with the conductive material. However, the material for the barrier metal film is not limited to titanium nitride film. Titanium tungsten (TiW) film, titanium film, and the combination of these films can also be used for the same purpose.

Figure 12B:
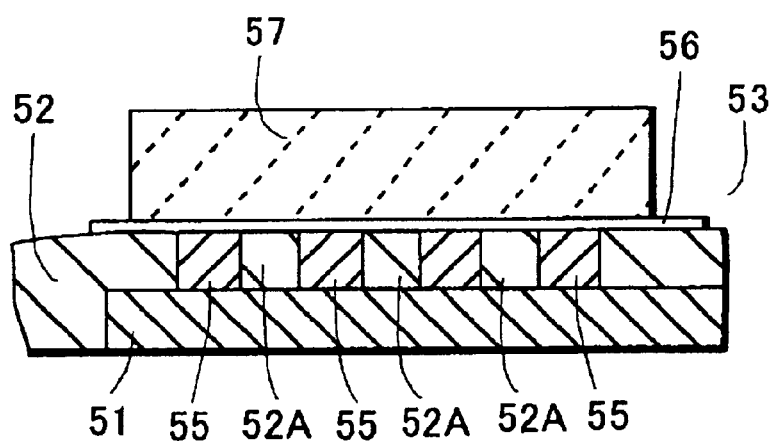
Figure 13:
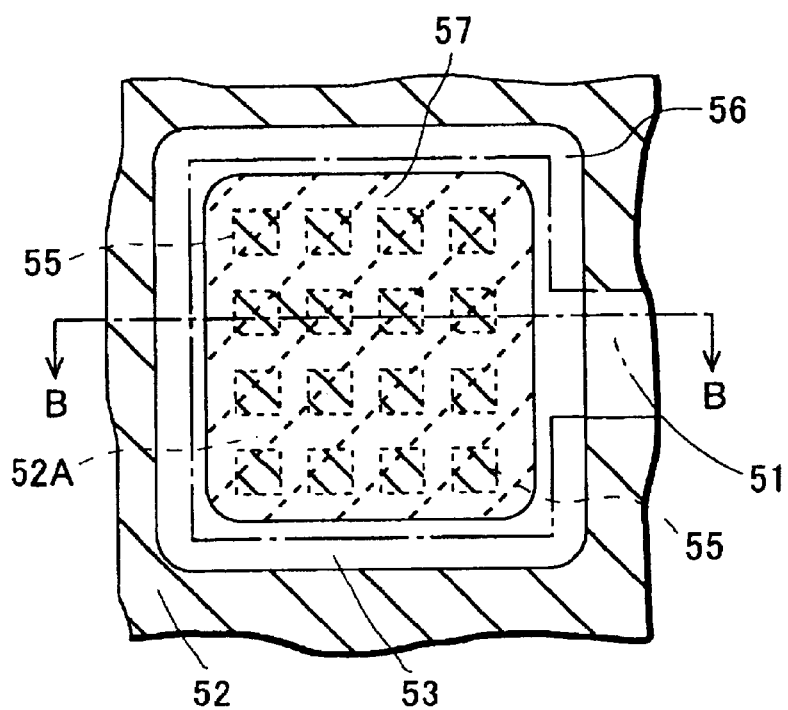
FIG. 13 is a schematic plan view of a bump electrode of the embodiment.

Then a gold bump electrode 57 having a thickness of about 15 $\mu$m is formed on the barrier metal film 56 by electroplating, and the barrier metal 56 on the passivation film 52 is removed by using a photoresist film (not shown in the figure) covering the gold bump electrode 57 as a mask. FIGS. 12A and 12B show only the upper portion of the device. FIG. 12B, which shows the final step of this embodiment, is a cross-sectional view of FIG. 13 cut along line B—B in FIG. 13.

Figure 14A:
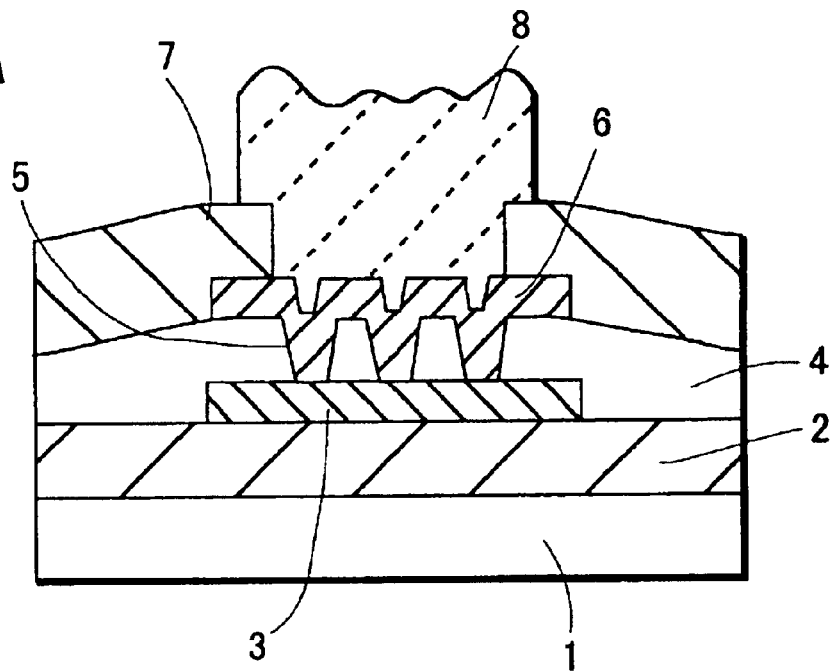
FIGS. 14A and 14B show a cross-sectional view and a schematic plan view, respectively, of a conventional bump electrode.
Figure 14B:
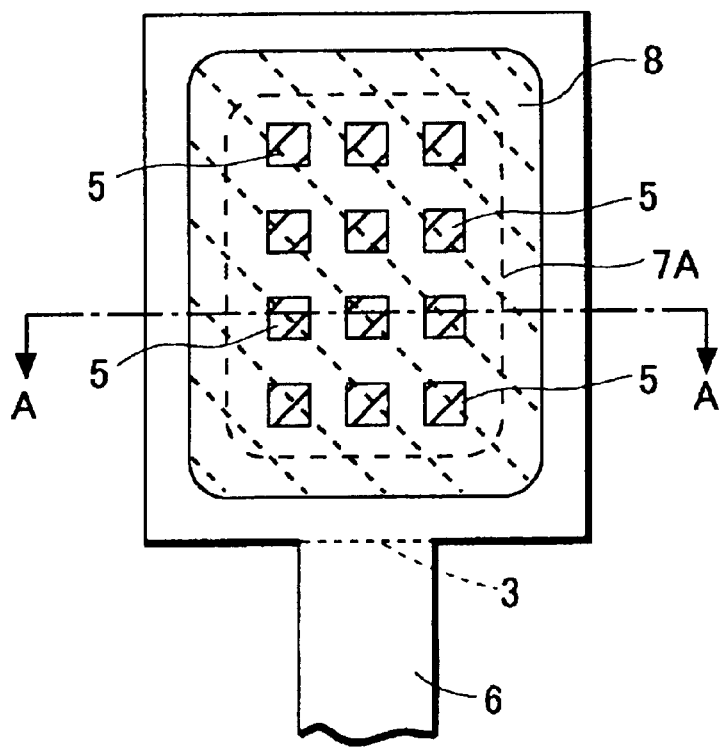

Therefore, unlike the conventional bump electrode structure (shown in FIGS. 14A and 14B), the middle portion of the gold bump electrode is not lower than its peripheral portion because the bump electrode is supported by the flat surface of the remaining passivation film 52 and the filled-in openings. Thus, the yield of the mounting process including TAB is improved.

In this configuration, since the third wiring layer 51 works as a power source line, it is designed to be wide. When the contact is made with the wide wiring layer, such as the third wiring layer 51, it is necessary to make a broad contact hole in order to lower the contact resistance. However, when various kinds of transistors are integrated through the patterning processes as fine as 0.35 $\mu$m, this minimum size is applied to each of the via holes. Thus, there should be a plurality of via holes with a minimum diameter defined by the resolution of the patterning process. In this case, if there is a plurality of fine via holes under the gold bump electrode, as in the case of the conventional structure (shown in FIGS. 14A and 14B), dents will be created on the top surface of the bump electrode 57, reflecting the uneven top surface of the third wiring layer 51 at the via holes.

Therefore, the via holes 50 are not formed under the gold bump electrode 57 in this embodiment. Instead, the via holes 50 are formed in the area away from the gold bump electrode 57. Thus, unlike the conventional structure, the dents will not be formed on the top surface of the bump electrode 57.

Additionally, by placing a portion of a lower wiring layer (the second wiring layer 49 or the combination of the second wiring layer 49 and the first wiring layer 47) under bump electrode, which does not make contact with the upper wiring layer (the third wiring layer), the flatness around the bump electrode may be maintained, because unevenness cased by the absence of the lower wiring layer under the bump electrode is eliminated.

In this embodiment, the via holes 50 are not formed underneath the bump electrode 57. Instead the via holes 50 are formed in the area away from the gold bump electrode 57. Furthermore, this embodiment achieves a flat top surface of the bump electrode by placing the bump electrode on a flat surface consisting of the filled-in openings and the remaining passivation film. However, this invention is not limited to this configuration. This invention is also applicable to the configuration, which has via holes underneath bump electrode.

The above is a detailed description of a particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A semiconductor device comprising:

a semiconductor substrate;

a passivation film formed on the semiconductor substrate and covering a wiring layer;

a plurality of via holes formed in the passivation film and filled with a conductive material, the filled via holes making physical contact with the wiring layer; and an electrode making contact with the conductive material and covering the plurality of via holes.

2. A semiconductor device comprising:

a gate oxide film disposed on a semiconductor substrate;

a gate electrode disposed on the gate oxide film;

a source layer and a drain layer each disposed adjacent to the gate electrode;

a semiconductor layer disposed underneath the gate electrode and forming a channel;

a lower wiring layer making contact with the source layer and the drain layer;

an insulating film covering the lower wiring layer;

an upper wiring layer making contact with the lower wiring layer through a via hole formed in the insulating film;

a passivation film covering the upper wiring layer;

a plurality of via holes formed in the passivation film and filled with a conductive material, the filled via holes making physical contact with the upper wiring layer; and an electrode making contact with the conductive material and covering the plurality of via holes.

3. The semiconductor device of claim 2, wherein the via hole connecting the upper wiring layer to the lower wiring layer is formed in an area of the insulating film excluding the area underneath the electrode making contact with the conductive material.

4. The semiconductor device of claim 2, further comprising an intermediate wiring layer disposed between the lower and upper wiring layers.

5. The semiconductor device of claim 2, further comprising a low impurity concentration layer having the same conductivity type as the source and drain layers and disposed underneath the gate electrode, the low impurity concentration layer being adjacent to the source and drain layers and being in contact with the semiconductor layer forming the channel.

6. The semiconductor device of claim 5, wherein the low impurity concentration layer is formed in the surface layer of the semiconductor layer forming the channel.

* * * * *